United States Patent [19]

Miller

[11] Patent Number: 4,680,537
[45] Date of Patent: Jul. 14, 1987

[54] METHOD AND APPARATUS FOR TESTING A CONDUCTIVITY SENSING CIRCUIT

[75] Inventor: Francis M. Miller, Snyder, N.Y.

[73] Assignee: Conax Florida Corporation, St. Petersburg, Fla.

[21] Appl. No.: 722,679

[22] Filed: Apr. 12, 1985

[51] Int. Cl.[4] .............................................. G01R 31/02
[52] U.S. Cl. .................................. 324/500; 324/439; 340/515
[58] Field of Search .............. 324/51, 424, 62, 60 CD, 324/439, 158 R; 340/515, 638, 636; 361/247, 248; 102/200, 202.5, 202.9; 364/487

[56] References Cited

U.S. PATENT DOCUMENTS

| | | | |
|---|---|---|---|
| 2,543,754 | 3/1951 | Beach | 324/51 |
| 2,976,485 | 3/1961 | Bartz | 324/51 |
| 3,366,055 | 1/1968 | Hollander | 324/158 R |
| 4,510,571 | 4/1985 | Dagostino et al. | 364/487 |

*Primary Examiner*—Reinhard J. Eisenzopf
*Assistant Examiner*—Jack B. Harvey
*Attorney, Agent, or Firm*—Christel, Bean & Linihan

[57] ABSTRACT

A method and apparatus for testing a circuit which senses the condition of an electrical quantity, the sensing circuit having a sensing portion which indicates a predetermined condition of the electrical quantity of a load connected between a pair of sensing terminals, and having a current conducing device which is activated a given time after the sensing portion indicates the predetermined electrical condition. The testing apparatus includes a network which is connected to the sensing circuit terminals for simulating a load having the electrical quantity to which the sensing circuit is responsive, the network having at least one branch which simulates the existence of the predetermined condition in the load, and the network having a timing component causing the predetermined condition to be simulated for a time adequate to test the sensing circuit response but inadequate to provide sufficient energy to activate the device. The network preferably has another branch for simulating the absence of the predetermined condition in the load, and a switch for selecting which of the branches is connected to the sensing circuit terminals. The testing apparatus also includes monitoring apparatus which is connected to the sensing circuit terminals for comparing the actual response of the sensing circuit to the load simulation provided by the network to the desired response of the network, and the monitoring apparatus indicates whether the actual and desired responses of the sensing circuit are within or without a predetermined range of coincidence.

14 Claims, 9 Drawing Figures

METHOD AND APPARATUS FOR TESTING A CONDUCTIVITY SENSING CIRCUIT

BACKGROUND OF THE INVENTION

This invention relates to the art of testing electrical circuits, and more particularly to a new and useful method and apparatus for testing a circuit in a manner preventing activation of a particular component in the circuit.

One area of use of the present invention is in testing a circuit for sensing the electrical conductivity of fluid which circuit activates a component in response to a predetermined condition of the conductivity, although the principles of the present invention can be variously applied. Such conductivity sensing circuits are employed for detonating an electro explosive device of a release mechanism for uncoupling a parachute canopy upon landing in water. It is necessary to test circuits of this type since they often must be on a standby basis for prolonged periods of time, and it is important to test such a circuit effectively and in a manner not detonating the electro explosive device associated with the circuit.

SUMMARY OF THE INVENTION

It is, therefore, a primary object of this invention to provide a new and improved apparatus for testing an electrical conductivity sensing circuit.

It is a more particular object of this invention to provide such apparatus which tests the sensing circuit in a manner which does not activate a particular component of the sensing circuit.

It is a more particular object of this invention to provide such apparatus for effectively testing a conductivity sensing circuit used for detonating the electro explosive device of a parachute canopy release mechanism in a manner which does not detonate the electro explosive device.

It is a further object of this invention to provide such apparatus for testing a plurality of response modes of an electrical conductivity sensing circuit.

It is a further object of this invention to provide a new and improved method for testing an electrical conductivity sensing circuit in a manner which does not activate a component of the sensing circuit.

It is a more particular object of this invention to provide such a method and apparatus effective in operation and convenient to perform and use.

The present invention provides a method and apparatus for testing a circuit which senses the condition of an electrical quantity, the sensing circuit having a sensing portion which indicates a predetermined condition of the electrical quantity of a load connected between a pair of sensing terminals, and having a current conducting component which is activated a given time after the sensing portion indicates the predetermined electrical condition. The testing apparatus includes a network adapted for connection to the sensing circuit terminals for simulating a load having the electrical quantity to which the sensing circuit is responsive, the network having at least one branch which simulates the existence of the predetermined condition in the load, and the network having timing means causing the predetermined condition to be simulated for a time adequate to test the sensing circuit response but inadequate to provide sufficient energy to activate the component. The network preferably has another branch for simulating the absence of the predetermined condition in the load, and switching means for selecting which of the branches is connected to the sensing circuit terminals. The testing apparatus also includes monitoring means adapted for connection to the sensing circuit terminals for comparing the actual response of the sensing circuit to the load simulation provided by the network to the desired response of the network, and the monitoring means indicates whether the actual and desired responses of the sensing circuit are within or without a predetermined range of coincidence.

The foregoing and additional advantages and characterizing features of the present invention will become clearly apparent upon a reading of the ensuing detailed description together with the included drawing wherein:

BRIEF DESCRIPTION OF THE DRAWING FIGURES

DETAILED DESCRIPTION OF THE ILLUSTRATED EMBODIMENT

Figure 1:
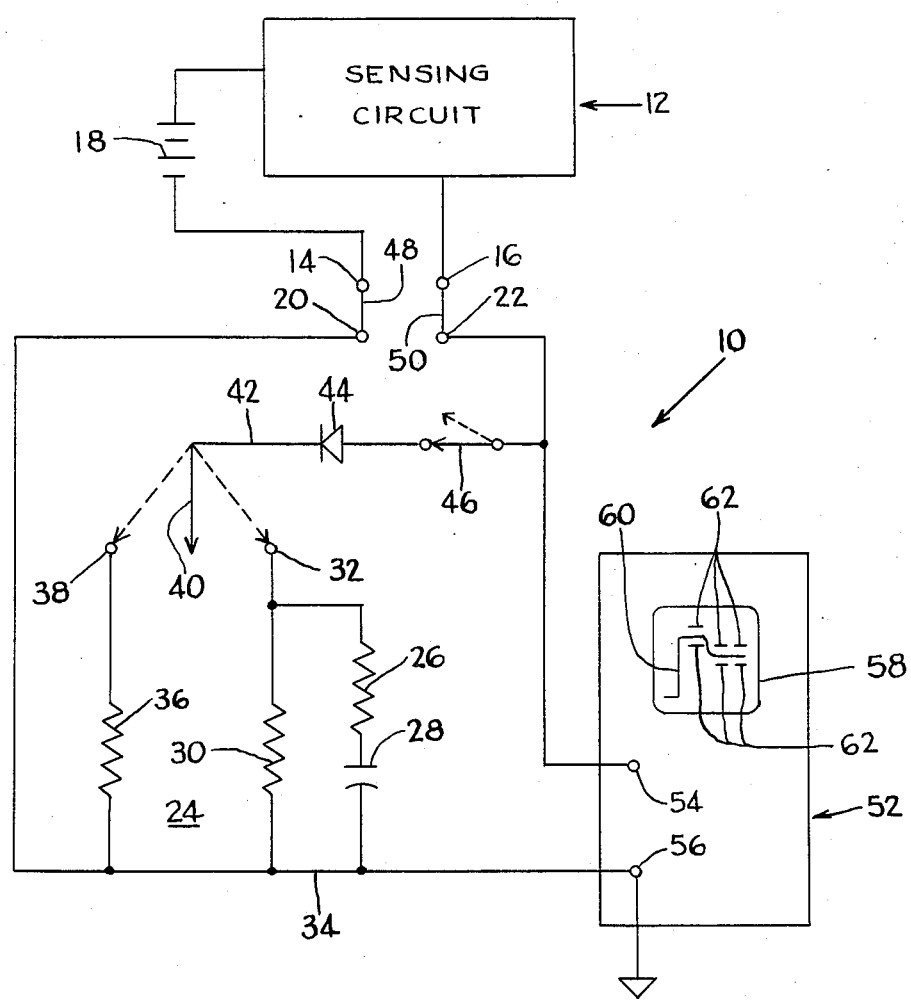
FIG. 1 is a schematic diagram of testing apparatus according to the present invention as it would appear in use for testing the response of a conductivity sensing circuit.
Figure 2:
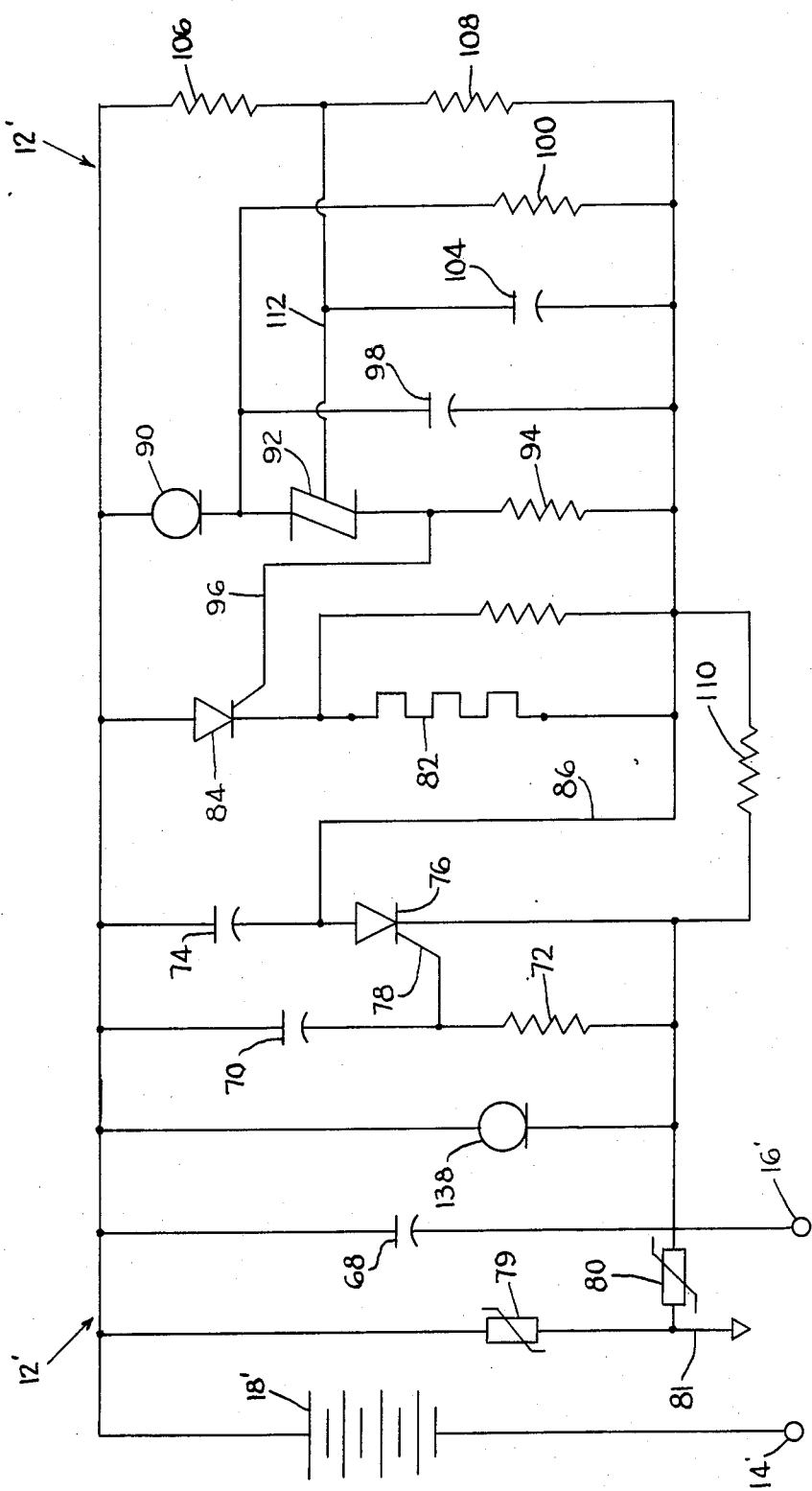
FIG. 2 is a schematic diagram of the conductivity sensing circuit of FIG. 1.

FIG. 1 illustrates apparatus 10 according to the present invention for testing a circuit 12 which senses the condition of an electrical quantity. Circuit 12 has a pair of sensing terminals or electrodes 14,16, a sensor portion operatively connected to terminals 14,16 for indicating a predetermined condition of the electrical quantity associated with a load connected between terminals 14,16 and a current conducting component which is activated within a predetermined activation time period after the sensor portion indicates the predetermined condition of the electrical quantity. The component also will require a certain amount of electrical energy in order to be activated. By way of illustration, circuit 12 can sense the electrical conductivity of fluid to which electrodes 14,16 are exposed and activate the current conducting component when the fluid conductivity has at least a predetermined magnitude and at least a predetermined rate of change in conductivity. The current conducting component can be an electro explosive device employed in a release mechanism for uncoupling a parachute canopy from its load upon landing in water, and the circuit can be operated by a battery 18. Such an illustrative circuit is shown in FIG. 2 and will be described in detail presently. It is necessary to test circuits of this type since they often must be on a standly basis for prolonged periods of time, and it is important to test the circuits effectively and in a manner not detonating the electro explosive device associated with the circuit.

The testing apparatus 10 according to the present invention comprises a pair of terminals 20 and 22 adapted for connection to the sensing circuit electrodes 14 and 16, respectively, and a network 24 connected to terminals 20,22 for simulating a load having the electrical quantity to which the sensing circuit 12 is responsive. Network 24 has at least one branch which simulates the existence of the predetermined condition of the electrical quantity associated with a load connected between sensing electrodes 14,16. In addition, the branch includes timing means causing the predetermined condition to be simulated for a period of time significantly less than the activation period of the current conducting component of circuit 12 but adequate to test the circuit response including the continuity of the component in circuit 12. In other words, the simulation is for an adequate testing time during which current flows through the component but not long enough to provide sufficient energy to activate the component.

For use with the illustrative circuit 12 which senses conductivity wherein the current conducting component is to be activated in response to the conductivity being greater than a predetermined value, the above-described branch of network 24 has an initial low resistance to simulate conductivity greater than that predetermined value and which resistance then is changed in response to operation of the timing means to a high resistance to simulate electrical conductivity lower than the predetermined value. This enables testing of the electrical continuity of the component of circuit 12 in response to conductivity greater than the predetermined value and in a manner preventing activation of the component.

As shown in FIG. 1, the branch of network 24 includes two portions connected in parallel, the first of the portions comprising a low magnitude resistor 26 in series with a capacitor 28 and the second of the portions including a relatively higher magnitude resistor 30. In particular, resistor 30 is connected across the series combination of resistor 26 and capacitor 28, and the parallel combination of resistors 30, resistor 26 and capacitor 28 is connected between a mode selection switch terminal or contact 32 and a line 34 leading to terminal 20. As will be described in detail presently, the network branch operates in a manner such that initially the sensing circuit 12 responds only to the low magnitude resistor 26 simulating a load between terminals 14,16 having a conductivity greater than the predetermined value. Then after the voltage on capacitor 28 increases during the testing time period, the circuit 12 responds to the higher magnitude resistor 30 simulating conductivity less than the predetermined value. The testing period is sufficiently small in duration so that the current conducting component within circuit 12 is provided with insufficient energy for actuation, for example detonation in the case of an electro explosive device, during the testing period.

The network 24 of the testing apparatus 10 of the present invention further comprises a second branch which simulates the absence of the predetermined condition of the electrical quantity associated with a load connected between electrodes 14,16 of sensing circuit 12. The second branch comprises a resistor 36 of relatively high magnitude which simulates low conductivity. Resistor 36 is connected between another mode selection switch terminal or contact 38 and line 34 leading to the terminal 20.

The testing apparatus 10 of the present invention further comprises switching means between network 24 and at least one of the apparatus terminals for selecting which of the branches is connected to the terminals. In the apparatus shown, a manually operated mode selection switch is provided having a switch arm 40 manually movable between a neutral position as shown in solid lines in FIG. 1 and positions engaging either of the afore-mentioned switch contacts 32 and 38. Switch arm 40 is connected electrically to testing apparatus terminal 22 through the combination of line 42, protective diode 44 and another mode selection switch 46. In particular, the cathode of diode 44 is connected to line 42 and the anode of diode 44 is connected through switch 46, which is closed during the testing modes in which network 24 is utilized, to the terminal 22. Switch 46 is manually operated in the illustrative apparatus shown. In the arrangement shown in FIG. 1, lines 48 and 50 represent suitable connections between testing apparatus terminals 20 and 22, respectively, and sensing circuit electrodes 14 and 16. The connections 48,50 can be made by leads, probes, electrical connectors or any other suitable means.

The testing apparatus 10 of the present invention further comprises monitoring means generally designated 52 connected to the terminals 20,22 for comparing the actual response of sensing circuit 12 to the load simulation provided by network 24 to the desired response of sensing circuit 12. The monitoring means 52 includes means for indicating whether the actual and desired responses of sensing circuit 12 are within or without a predetermined range of coincidence. In particular, the monitoring means 52 samples or inspects waveforms or portions thereof appearing across testing apparatus terminals 20,22 and hence across sensing electrodes 14,16 which waveforms represent responses of sensing circuit 12 to load simulations by network 24, and monitoring means 52 compares those waveform or portions thereof to reference waveforms corresponding to desired responses of sensing circuit 12. This comparison enables monitoring means 52 to indicate the amount of deviation between actual and desired response.

In the arrangement shown in FIG. 1, monitoring means 52 comprises an oscilloscope having a pair of input terminals 54,56 and a screen 58. Input terminal 54 is connected to testing apparatus terminal 22 and input terminal 56 which is a reference terminal is connected to testing apparatus terminal 20. Screen 58 preferably is of the flat type and provided with graphical information to indicate visually whether the actual and desired responses of sensing circuit 12 are within or without a predetermined range of coincidence. As will be described in further detail presently, an illustrative waveform 60 is shown in FIG. 1 on screen 58 representing a response of circuit 12 to load simulation provided by resistor 36 of network 24, and lines 62 on screen 58 indicate a predetermined range of coincidence between actual and desired waveforms. In addition, switch 46 when open serves to disconnect network 24 from the testing apparatus terminals 20,22 thereby completing a circuit including the sensing circuit battery 18 and monitoring means 52 for monitoring the battery in a manner which will be described.

FIG. 2 illustrates a fluid conductivity sensing circuit 12' wherein the current conducting component is an electro explosive device and which can be tested by the apparatus 10 of the present invention. Circuit 12' and the electro explosive device thereof can be employed in a release mechanism for uncoupling a parachute canopy from its load upon landing in water. Circuit 12' operates to detonate the electro explosive device thereof in response to fluid having a predetermined minimum electrical conductivity under conditions of a predetermined minimum rate of change in conductivity. For a detailed description of the circuit of FIG. 2 and its operation, reference may be made to U.S. Pat. No. 4,513,248 issued Apr. 23, 1985 entitled "Fluid Conductivity Sensor" and assigned to the assignee of the present invention, the disclosure of which is hereby incorporated by reference. Briefly, circuit 12' includes a pair of sensing electrodes 14', 16' of suitable metal and the circuit is operated by battery 18'. Electrode 14' is connected to the negative terminal of battery 18' and the sensing portion of circuit 12' includes a first capacitor 68 connected between the positive terminal of battery 18' and electrode 16'. The sensing portion also includes the series combination of a second capacitor 70 and a resistor 72 connected across capacitor 68. The circuit 12' further comprises the series combination of an ignition capacitor 74 and a silicon controlled rectifier 76 connected across the combination of a capacitor 70 and resistor 72. The gate terminal 78 of controlled rectifier 76 is connected to the junction of capacitor 70 and resistor 72. The series combination of Varistors 79,80 is connected across capacitor 68, and the junction of Varistors 79,80 is connected by line 81 to a circuit reference such as the apparatus housing.

In operation, when sensing electrodes 14' and 16' are exposed to fluid having at least some degree of electrical conductivity, there will be some flow of electrical current through the fluid between electrodes 14' and 16' and through the conductivity sensing portion of the circuit of FIG. 2. In particular, the electron flow is from the negative terminal of battery 18' to electrode 14' and through the fluid to electrode 16' and then through the several parallel circuit paths shown in FIG. 2 to the positive terminal of battery 18'. However, under specified no-fire conditions as determined by the magnitudes of the circuit components, there will be insufficient energy coupled to the gate 78 of controlled rectifier 76 through capacitor 70 to turn the rectifier on and therefore no flow of current through the load, i.e. no charging of capacitor 74. By way of example, when the circuit of FIG. 2 is used in a canopy release mechanism, the specified no-fire condition is water having a conductivity of 250 micro-mhos or less.

In the illustrative use of the apparatus in a canopy release mechanism, the specified all fire condition is water having a conductivity of 10,000 micro-mhos or greater. When the electrodes are exposed to such water the rate of voltage rise on capacitor 68 becomes sufficient to couple the required energy through capacitor 70 to gate 78 of controlled rectifier 76 turning it on and thereby allowing the battery 18' to begin charging the ignition capacitor 74. In addition, the exposure of the electrode to the electrically conductive fluid is under conditions where the rate of change of conductivity is at least a predetermined minimum value. For example, under conditions where the electrodes have been exposed to atmospheric air and suddenly are exposed to a static body of water having the aforementioned conductivity of 10,000 micro-mhos or greater, both the conductivity of the water and the time rate of change in the conductivity of air to the conductivity of the water are sufficiently great to couple the energy through capacitor 70 to gate rectifier 76 into conduction. In other words, as the parachute and person wearing same descend through air which is nonconductive and then suddenly enter a body of water such as the ocean, there is a very rapid rate of change in conductivity sensed by the electrodes and it is a sufficiently rapid rate of rise to cause gating of the rectifier 76 into conduction. However, when the electrodes are exposed first to air and then are exposed to rain, salt water spray or fog, the time rate of change in conductivity from air to the rain, salt water spray or fog is relatively slow and in any event not great enough to couple sufficient energy to gate rectifier 76 into conduction. Such conditions of rain, salt water spray and fog typically are encountered by stationary aircraft on a carrier vessel at sea.

The circuit 12' further comprises an electro explosive device 82 connected in series with a silicon controlled rectifier 84. The anode of controlled rectifier 84 is connected to the one terminal of ignition capacitor 74, the cathode thereof is connected to one terminal of the explosive bridgewire 82, and the other terminal of device 82 is connected by line 86 to the other terminal of ignition capacitor 74. A protective resistor 88 is connected across electro explosive device 82. The series combination of a current regulator 90, three terminal semiconductor switch 92 and resistor 94 is connected across the combination of controlled rectifier 84 and electro explosive device 82. The gate terminal of controlled rectifier 84 is connected by a line 96 to the junction of switch 92 and and resistor 94. A parallel RC network comprisin capacitor 98 and resistor 100 is connected between the anode terminal of semiconductor switch 92 and line 86, and a capacitor 104 is connected between the gate terminal of semiconductor switch 92 and line 86. The circuit 12' is completed by a voltage divider comprising the series combination of resistors 106, 108 and 110. The resistors 106 and 108 are connected across the combination of current regulator 90, simiconductor switch 92 and resistor 94, and the junction of resistor 106 and 108 is connected by line 112 to the gate terminal of semiconductor switch 92. Resistor 110 is connected to sensing electrode 16 ' and the junction of resistors 108 and 110 is connected to line 86.

During the all-fire mode of operation, the function of circuit 12' is to provide ignition energy to electro e:losive device 82 when the sensing electrodes are subjected to rapidly changing conductive environment. In particular, when electrodes 14',16' are subjected to fluid of rapidly increasing electrical conductivity, capacitor 69 charges quickly and the charging time is limited essentially by the conductivity between electrodes 14',16'. If the conductivity is high enough, for example greater than 10,000 micro mhos, a portion of the signal charging caacitor 68 is coupled through capacitor 70 across resistor 72 and the gate/cathode connections of controlled rectifier 76 turning the rectifier on. Operation of controlled rectifier 76, in turn, allows the ignition capacitor 74 to charge up and it also supplies power to a time delay portion of circuit 12'. In particular, the time delay portion includes current reulator 90, semiconductor switch 92, capacitor 98, resistor 100, capacitor 104 and the resistors 106 and 108 of the voltage divider. After a predetermined time delay, for example about 1.2 seconds, semiconductor switch 92 is closed with the result that the time delay portion provides controlled rectifier 84 with a turn-on pulse at resistor 94. Operation of controlled rectifier 84 completes a discharge path for stored energy from capacitor 74 through electro explosive device 82 causing explosive ignition thereof and functioning of the parachute canopy release mechanism previously described.

During the foregoing operation, as the charge on the ignition capacitor 74 increases over time, the increasing voltage across capacitor 74 is reflected across the time delay circuit portion described above. Although the rate of voltage rise on the ignition capacitor 74 is exponential and a function of the conductivity of the fluid to which the electrodes 14',16' are exposed, the current regulator 90 causes the rate of voltage rise on capacitor 98 to be essentially constant over a widely changing range of applied voltage. The rate of voltage rise on capacitor 104 also is constant until it reaches the level determined by the relative magnitudes of resistors 104 and 106 whereupon the capacitor voltage is limited to that level or plateau. When the increasing voltage on capacitor 98 reaches a value exceeding the voltage level on capacitor 104 by an amount equal to the anode-gate switching voltage of semiconductor device 92, the device 92 will turn on discharging capacitor 98 through resistors 94 causing a voltage/current pulse on the gate terminal of controlled rectifier 84 causing it to turn on. When controlled rectifier 84 is turned on, ignition capacitor 74 discharges through the controlled rectifier 84 and the electro explosive device 82 thereby causing explosive ignition of the device 82.

Figure 3:
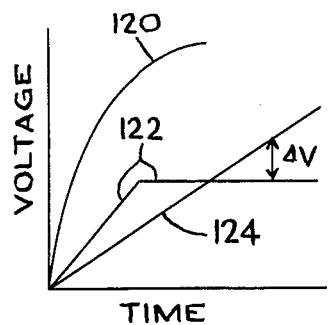
FIG. 3 is a graph including waveforms illustrating operation of the circuit of FIG. 2 during one mode.

The foregoing is illustrated further in FIG. 3 which includes waveforms of the build-up of voltage over time on the capacitors 74,98 and 104 during the all-fire mode. Waveform 120 illustrates the relatively fast, exponential build-up of voltage on ignition capacitor 74 as previously described. Waveform 122 shows the relatively linear build-up of voltage on capacitor 104, which is connected to the gate terminal of semiconductor switch 92, until that voltage reaches the level or plateau determined by the voltage divider network. Waveform 124 illustrates the relatively linear build-up of voltage on capacitor 98, which is connected to the anode terminal of semiconductor switch 92. The build-up of the voltage capacitor 98 is slower than the build-up on capacitor 104, and since capacitor 98 is not connected to the voltage divider it continues to build-up linearly. When the voltage on the gate of switch 92 becomes negative with respect to the voltage on the anode of switch 92 by a predetermined amount $\Delta V$, semiconductor switch 92 closes to cause the operation of the other components of the circuit as previously described.

During the no-fire mode of operation, the function of the circuit 12' is to prevent explosive ignition of electro explosive device 82. This would of course occur during normal dry atmospheric conditions where the circuit is completely dormat due to the fact that sensing electrodes 14',16' being exposed to dry atmosphere are insultated from each other with the result that the negative terminal of battery 18' is separated from the circuit 12' by the insultated sensing probes 14',16'. This also occurs when the environment becomes slightly conductive, such as when electrodes 14',16' are exposed to rain, salt water spray and fog. The circuit also serves to prevent accidental detonation of electro explosive device 82 in response to a component failure or other circuit malfunction. For example, such situations can involve a slow build-up of charge on capacitor 68 during slightly conductive conditions such as rain, salt water spray and fog followed by a component failure placing the voltage built-up on capacitor 68, which could be nearly the battery voltage after a significant build-up time, across the operating portion of the circuit. In particular, during exposure of electrodes 14',16' to salt fog, for example, the rate of change in electrical conductivity of the fluid to which the electrodes 14', 16' are exposed is too slow to place the circuit in the all-fire mode. However, after such exposure, for a prolonged period of time, capacitor 68 can become highly charged and there is practically zero resistance between electrodes 14',16' with the result that practically the entire voltage of battery 18' is placed across the branch of the circuit including silicon controlled rectifier 76 and ignition capacitor 74. Controlled rectifier 76 has not been turned on, however, because the rate of change in conductivity of the fluid on electrodes 14',16' has been too slow. However, in the event of a component failure, such as break down or shorting of controlled rectifier 76 or shorting of capacitor 70, the entire battery voltage could be applied across the operating portion of the circuit thereby causing unwanted detonation of electro explosive device 82.

Accordingly, in the no-fire mode of operation, when the environment becomes slightly conductive so that one or two volts are present across capacitor 68, current will flow through resistors 110 and 100, through the current regulator 90, and through resistors 108 and 106. If the conductivity of fluid contacting electrodes 14',16' increases to a point where the relative voltages developed across capacitors 98 and 104 provide the required anode-gate voltage difference on semiconductor switch 92, the switch 92 is turned on and provides a discharge path for capacitors 98 and 104 through resistor 94. This, in turn, fires controlled rectifier 84 completing a discharge path for ignition capacitor 74 through electro explosive device 82 causing a nominal no-fire energy pulse through device 82. Thus, rectifier 84 is turned on to cause current flow through device 82 early, i.e. before the voltage or capacitor 68 builds up to a dangerously high level.

Figure 4:
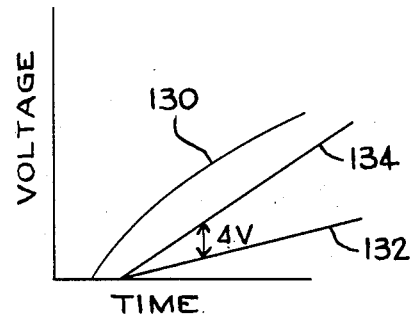
FIG. 4 is a graph including waveforms illustrating operation of the circuit of FIG. 2 during a different mode.

The foregoing is illustrated further in FIG. 4 which includes waveforms of the build-up of voltage over time on the capacitors 74,98 and 104 during the no-fire situation described above. Waveform 130 illustrates the relatively slow build-up of voltage on capacitor 74 as previously described. When electrodes 14',16' are exposed to relatively lower conductivity fluid during these conditions, this is seen by the circuit 12' as a relatively high resistance between the electrodes and hence an increase in the resistance in series with capacitor 104. This, in turn, increases the time constant of the gate circuit of semiconductor switch 92 resulting in a relatively slower linear build-up of voltage on capacitor 104 illustrated by waveform 132 in FIG. 4. With respect to capacitor 98 in the anode circuit of switch 92, however, although this portion of the network also sees a higher series resistance due to electrodes 14',16', being exposed to lower conductivity fluid, current regulator 90 compensates for this by tending to maintain the current constant and thereby keeping the anode time constant at about the same magnitude as for all fire conditions. This is illustrated by the waveform 134 in FIG. 4. As a result, the voltage on the gate terminal of switch 92 is negative with respect to the anode voltage by the amount $\Delta V$ at a much earlier time as illustrated in FIG. 4.

When the foregoing mode of operation occurs, the circuit has a latching or holding function which serves to keep switch 92 open with the result that no additional gating or turn on pulses are applied to the gate of controlled rectifier 84. This function is provided by the voltage divider whereby the magnitudes of resistors 106,108 are selected to maintain the required anode-gate voltage differential on switch 92 to keep it closed once the foregoing operation has concluded. From another point of view, the switch 92 has a certain minimum holding current and the magnitudes of resistors 106,108 are selected to maintain that current even if the voltage on the anode of switch 92 falls below the switching level. The current regulator 90 also plays a role in providing a minimum holding current to semiconductor switch 92. Thus, the network includes latching or holding circuit means in the form of resistors 106,108 and current regulator 90 which, alone or in combination, function to keep semiconductor switch 92 closed, after the foregoing mode of operation has occurred, either by maintaining a predetermined holding current through switch 92 or by maintaining the required anode-gate voltage differential on switch 92.

Thus, under specified all-fire conditions the circuit 12' operates to cause explosive ignition of device 82, such all-fire conditions typically being fluid having a conductivity of greater than 10,000 micro mhos under conditions rapidly changing conductivity. Under specified no-fire conditions the circuit 12' operates to cause a nominal no-fire energy pulse to flow through device 82 with no ignition thereof, and this is followed by the latching or holding mode whereby the circuit 12' will not provide any further turn on pulses to controlled rectifier 84 until the circuit is reset. Such no-fire conditions typically are the salt fog environmental conditions previously described and fluid having a conductivity of 10,000 micro ohms or less.

There is a range within the specified no-fire conditions where it is desired to prevent circuit 12' from being placed in the latching or lockout state. Physically, this would be a situation where a person is parachuting from an aircraft through rain toward a body of water. Obviously, it is important to prevent circuit 12' from entering the lockout state during the brief exposure to rain during descent. Thus a conductivity range is determined in which it is desired to prevent the latching or lockout operation, and in the illustrative use with a canopy release mechanism this is fluid having a conductivity of 250 micro mhos or less which is believed sufficiently adequate to include all situations and conditions involving descent through rain.

The foregoing is accomplished by having the entire voltage maintained between electrodes 14',16' when the electrodes are exposed to fluid having conductivity in the predetermined low range, i.e. the 0–250 micro mhos exemplary range mentioned above, and then having the entire voltage placed across the circuit 12' for normal operation of the circuit when the fluid conductivity is above that range, i.e. greater than 250 micro mhos. Accordingly, there is provided current regulating means in the form of current regulating diode 138 connected across the sensing circuit 12' for placing the circuit voltage across electrodes 14',16' when the conductivity of the fluid is below a predetermined magnitude and for placing all or substantially all of the voltage across the sensing circuit 12' when the conductivity of the fluid is greater than a predetermined magnitude. The current regulating diode 138 acts as a short circuit when the voltage across the circuit is zero in response to electrodes 14',16' being exposed to fluid having zero electrical conductivity. As the fluid conductiviity increases the diode 138 continues to act as a short circuit until the predetermined conductivity level is reached whereupon diode 138 thereafter acts as a variable resistance of rapidly increasing magnitude approaching an open circuit to maintain a level of current corresponding to that level of fluid conductivity. Since the diode 138 acts as a short circuit until the predetermined level of conductivity is reached, during that time all of the voltage appears between electrodes 14',16' because there are zero volts across diode 138. When the predetermined level of conductivity is reached, thereafter the resistance of diode 138 increases and the proportion of the voltage across diode 138 and hence across circuit 12' increases thereby providing regular operation thereafter.

The testing apparatus 10 of the present invention operates in the following manner. The apparatus 10 is contained in a housing and advantageously can be of a convenient and manageable size and weight so as to be relatively portable. It can be stored in a convenient location away from the circuit to be tested, and carried by hand or other suitable means to the location of testing when needed. The illustrative sensing circuit 12' in a canopy release mechanism typically will be in an aircraft when the test is to be made which can be in a hanger or airport on land and on an aircraft carrier at sea. Such testing normally will be performed during preflight checkout procedures prior to take-off. The apparatus 10 is brought into proximity to sensing apparatus 12' and terminals 20 and 22 are connected in a suitable manner to sensing electrodes 14' and 16'. Assume that the first test to be performed is on the voltage of battery 18'. Accordingly, arm 40 of the mode selection switch is in the neutral position as shown in FIG. 1 and switch 46 is moved to the open condition shown in broken lines to disconnect network 24 from the apparatus. A horizontal line will appear on the oscilloscope screen 58 indicative of the d.c. level of the battery voltage. A colored horizontal line or other appropriate indicia can be placed on screen 58 to indicate visually the minimum acceptable voltage level for battery 18'. Thus, if the battery voltage is below the acceptable level, this will be indicated by a horizontal line on screen 58 spaced below the afore-mentioned indicia. Accordingly, the monitoring means indicates that the difference between actual and desired battery voltage exceeds the acceptable limit.

Next, assume that after battery voltages has been checked the apparatus 10 is used to check the response of circuit 12' to a load simulating fluid between electrodes 14',16' having a conductivity above the predetermined minimum magnitude discussed previously. Switch 46 is moved to the closed position to connect network 24 to the apparatus 10, and arm 40 of the mode selection switch is moved into contact or engagement with contact 32. As a result, the first branch of network 24 including the combination of resistor 26 and capacitor 28 in parallel with resistor 30 is connected between the sensing electrodes 14',16'. Initially, i.e. at the instant switch arm 40 engages contact 32, there are zero volts on capacitor 28, and the initial zero volts on capacitor 28 appears to circuit 12' like a component having zero resistance and, equivalently, infinite conductivity. Therefore, the sensing circuit 12' initially sees only the low magnitude resistor 26 and this simulates a load, such as a fluid, of high conductivity between sensing electrodes 14',16'. The response of circuit 12' to this is a rapid build-up of voltage on capacitor 68 causing silicon controlled rectifier 76 to turn on and causing ignition capacitor 74 to begin charging. The response of circuit 12' to the simulated load provided by the first branch of network 24 is illustrated by the waveform in FIG. 5 generally designated 140, and the initial response of circuit 12' including the charging of ignition capacitor 74 is indicated at 142. If this response were allowed to continue, the voltage on capacitor 74 would build up further as indicated by the broken line continuation of waveform portion 142 whereupon a level would be reached where detonation of electro explosive device 82 would occur. However, this is prevented by the testing apparatus 10 of the present invention in the following manner.

As previously described, capacitor 28 initially has zero volts thereon and circuit 12' therefore sees only the low magnitude resistor 26. Immediately thereafter, capacitor 28 charges rapidly and in the course of so doing looks more and more like a large impedance to sensing circuit 12'. By way of example, in an illustrative circuit, the charging time for capacitor 28 is about 20 to 30 milliseconds. Then circuit 12' sees the relatively large resistor 30 in parallel with another large resistance, i.e. the large impedance of charged capacitor 28, which then is viewed by circuit 12' as a large resistance and thus a low conductivity load between sensing electrodes 14',16'. This causes circuit 12' to change its response to a much slower build-up of voltage on ignition capacitor 74 as indicated by portion 144 of the waveform in FIG. 5. If electro-explosive device 82 were not connected properly in the circuit, or if it were defective so as to create an open circuit, ignition capacitor 74 simply would continue to charge at the relatively slow rate indicated by the broken line extension of waveform portion 144. This serves as an indication of an open bridgewire condition.

Otherwise, if device 82 is properly connected and in satisfactory condition, the slow build-up of charge on ignition capacitor 74 causes early firing of silicon controlled rectifier 84 as previously described to discharge ignition capacitor 74 through electro explosive device 82 but at an early or premature time so that there is insufficient energy to detonate device 82. The firing of silicon controlled rectifier 84 and flow of current through device 82 is represented by the vertical waveform portion 148 in FIG. 5. The time constant of the waveform portions 142,144, the amplitude of the transition 146, and the time constant of portion 148 can be examined to determine if they come within acceptable ranges.

Thus, the foregoing operation of testing apparatus 10 may be viewed as in effect fooling the sensing circuit 12' in having it see the low magnitude resistor 26 initially and for a time sufficient to check the response of circuit 12' and then have the sensing circuit 12' see the high resistance to prevent firing of electro explosive device 82.

Upon completion of the foregoing test, apparatus 10 can be used to check the response of circuit 12' to a load simulating fluid conductivity between electrodes 14',16' having a conductivity below the predetermined minimum magnitude discussed previously. Arm 40 of the mode selection switch is moved from its previous position into contact or engagement with contact 38. As a result, the second branch of network 24 comprising resistor 36 is connected between sensing electrodes 14',16'. Just prior to the instant arm 40 engages contact 38 there is an open circuit between sensing electrodes 14',16' which appears to circuit 12' like a load of infinite resistance and, equivalently, zero conductivity. When arm 40 engages contact 38 to place the relatively large magnitude resistor 36 between sensing electrodes 14',16' this appears to circuit 12' like a load of relatively large resistance and, equivalently, low conductivity. The response of circuit 12' to the simulated load provided by the second branch of network 24 is illustrated by the waveform in FIG. 5 generally designated 150. In particular, the initial portion 152 represents the circuit response where current regulating diode 138 initially is closed during the transition from near zero to very low conductivity load between electrodes 14',16'. The waveform portion 154 represents the circuit response including voltage build-up on capacitor 68 during the transition of diode 138 from a closed condition to an open condition when the current reaches the level which diode 138 regulates. The waveform portion 156 illustrates the circuit response including very slight further increase in voltage on capacitor 68, in other words a levelling off to a steady state value. The time constant of the waveform portion 154 and the steady state value reached by waveform portion 156 can be examined to determine if they come within acceptable ranges.

Figure 5:
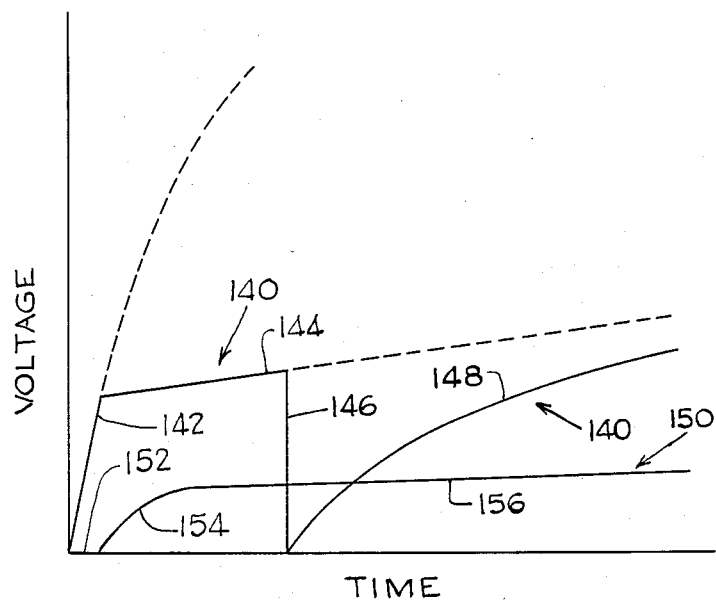
FIG. 5 is a graph including waveforms illustrating operation of the testing apparatus of FIG. 1.
Figure 6:
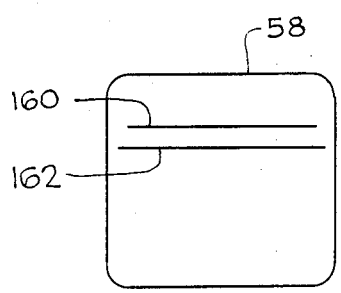
FIGS. 6–8 are diagrammatic views illustrating three different visual displays provided by the monitoring means in the apparatus of FIG. 1.
Figure 7:
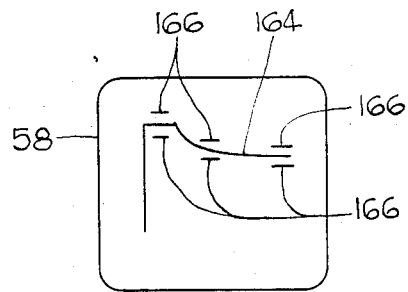
Figure 8:
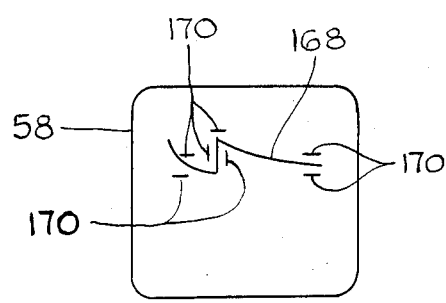

The foregoing is illustrated further by FIGS. 6-8 which show waveform displays appearing on screen 58 of the monitoring means 52 in the testing apparatus of FIG. 1. Turning first to FIG. 6, the horizontal line 160 is a waveform resulting during a test of battery voltage as previously described and line 162 which can be permanently affixed to screen 58 serves as an indicator below which the battery voltage should not lie as previously explained. In FIG. 7 there is a waveform 164 resulting during a test simulating a low conductivity load, the waveform 164 being similar to waveform 150 shown in FIG. 5 but inverted due to oscilloscope action. Lines 166 affixed to screen 58 provide indications whether the waveform portions are within acceptable ranges of time constants and amplitudes as previously described. In FIG. 8 there is a waveform 168 resulting during a test simulating a high conductivity load, the waveform 168 being similar to waveform 140 shown in FIG. 5 but inverted due to oscilloscope action. Lines 170 affixed to screen 58 provide indications whether the waveform portions are within acceptable ranges of time constants and amplitudes as previously described. Thus the monitoring means 52 provides an indication, in the foregoing illustration a visual indication, of whether or not the response of circuit 12' is within acceptable limits. If any of the waveforms or portions thereof in the displays illustrated in FIGS. 6-8 are observed to be outside of the ranges indicated by the markings or screen 58, this signals to the observer that there may be a circuit malfunction and appropriate repair or replacement then can be made.

By way of example, in an illustrative circuit, resistor 26 has a magnitude of 100 ohms, capacitor 28 has a capacitance of 110 microfarads, and resistor 30 has a magnitude of 1800 ohms. Resistor 36 has a magnitude of 4000 ohms which simulates a conductivity of 250 micro mhos at 6.2 milliamperes, the current to which diode 138 regulates the illustrative circuit 12' shown in FIG. 2. In this connection, the foregoing exemplary values for the circuit components are for use with components for circuit 12', the exemplary magnitudes of which are given in the above-referenced patent entitled "Fluid Conductivity Sensor".

Figure 9:
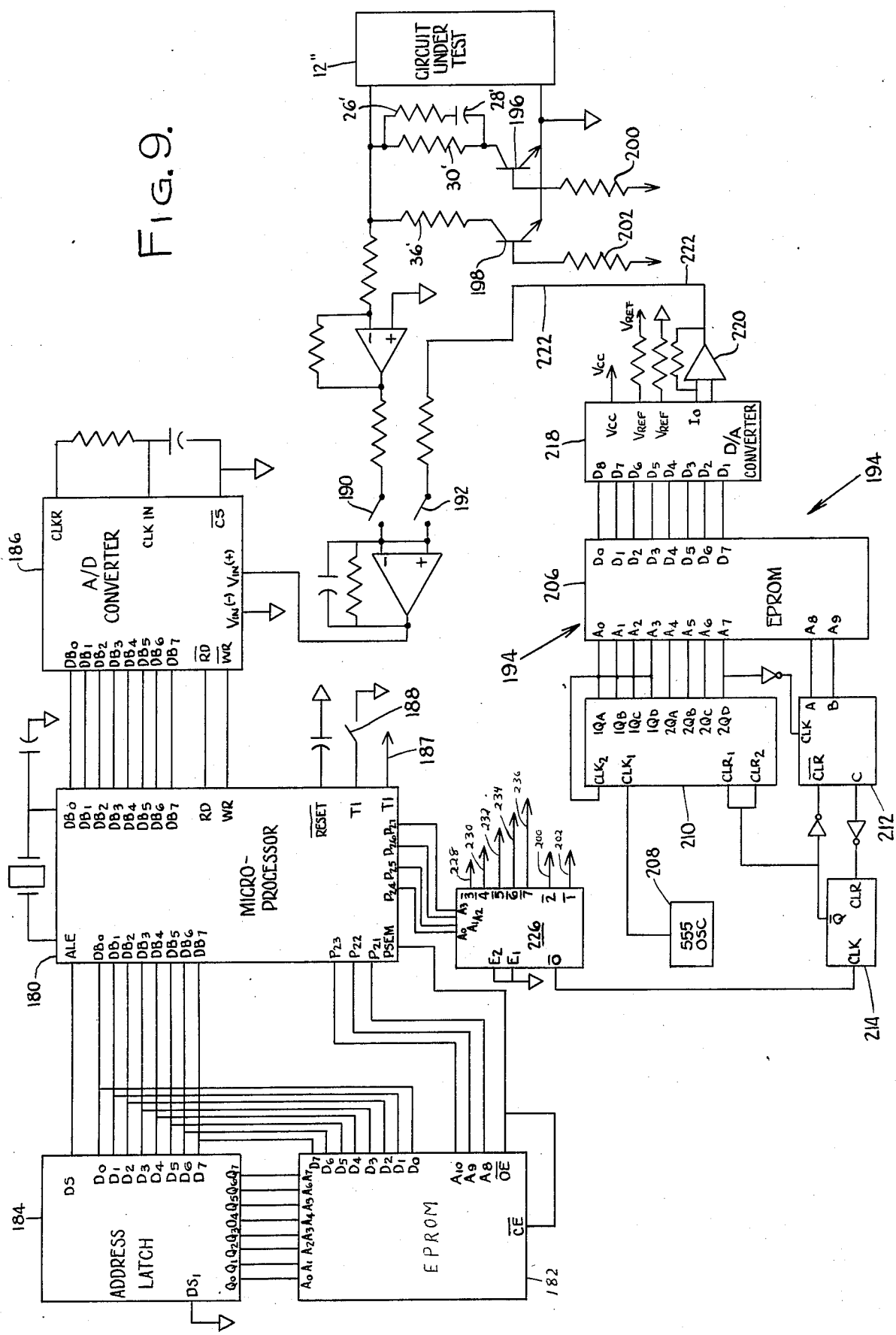
FIG. 9 is a schematic diagram of an alternative form of monitoring means for use in the testing apparatus of FIG. 1.

FIG. 9 shows a microprocessor arrangement useable as another form of monitoring means in the testing apparatus of FIG. 1. The system microprocessor executes instructions stored in an erasable programmable read only memory, and the test mode selection provided by switches 40 and 46 in the arrangement of FIG. 1 can be controlled by the microprocessor in response to commands from the operator. The responses of the circuit 12 under test in the form of voltage waveforms are scaled, digitized and then stored in a temporary memory in the microprocessor system, all in a known manner, for test comparison purposes. Suitable indicators are provided to indicate a yes-no type of signal as to whether the test was passed. The microprocessor arrangement also can include a self-test or diagnostic circuit which provides an output analog waveform derived from another EPROM memory which is applied to the microprocessor arrangement to test its operational status.

As shown in FIG. 9, the system includes a microprocessor 180 which can be an Intel 8035L processor including a 2.0 megahertz crystal clock time base. This processor uses an 8 bit data and address bus and includes 64 bytes of internal memory for data processing purposes. The system control software is stored in a 2K×8 EPROM memory 182 which can be an Intel 2716 type, and the microprocessor 180 communicates with the EPROM memory 182 by means of an addres latch 184 which stores address data multiplexed on the processor data bus. Latch 184 can be an Intel 8212 type. An 8 bit analog-to-digital converter 186 converts the analog voltage of the circuit 12 under test into a digital form suitable for entering into the microprocessor 180. Operating voltage is supplied on line 187 under control of a switch 188 which when closed starts the test procedure.

A circuit under test 12" is connected to the system in the manner shown in FIG. 9 which involves analog input processing including connection to the circuit under test 12" and summary of the self-test output waveform. Electronic switches 190,192 under control of microprocessor 180 select the system input voltage source as the circuit under test 12" or the self-test circuit generally designated 194 in FIG. 9. During testing of circuit 12", switch 190 is closed, switch 192 opened and transistor switches 196,198 control which of the impedance branches is connected across the sensing terminals of circuit 12" in a manner similar to manually operated switch 40 in the apparatus of FIG. 1. In this connection the branches include components similar to those of FIG. 1 but with a prime designation. Transistor switch 196 and 198 are operated in a known manner in response to control signals on buses 200 and 202, respectively, from microprocessor 180.

During the self-test mode, switch 190 is open and switch 192 is closed so that the system input voltage is obtained from the self-test circuit output. The self-test waveform is stored in an EPROM memory 206 which can be an Intel 2758 type. The address code for the EPROM 206 is generated by counting 2 KHZ pulses produced by a 555 based oscillator 208. These pulses are counted by circuits 210,212 and 214 to generate the EPROM address code necessary to output the stored self-test waveform. The output of EPROM 206 is 8 bits of data representing the self-test waveform which are converted into an analog voltage by analog-to-digital converter 218 which develops an output current signal proportional to the amplitude of the input digital signal.

A summing amplifier 220 transforms the D/A output current into an analog voltage on line 222.

A function select circuit 226 decodes the output signals from microprocessor 180 into individual control signals for driving panel display indicators and the system electronic switches. For example, lines 228,230, 232,234 and 236 operate light-emitting diodes associated with the following indicators, respectively: internal failure, battery failure, electro explosive device failure, circuit failure, and all systems ok. Lines 200 and 202 from the base terminals of the switching transistors 196 and 198, respectively, also are connected to outputs of circuit 226.

In the test of battery voltage associated with the circuit under test 12", a number of readings of battery voltages is taken over a time interval, for example 0.5 second, a number of the first and last data points are discarded to avoid erroneous readings, and the data points in the center of the time interval are averaged and compared to a minimum acceptable battery voltage, for example 22 volts.

In the test of the response of circuit 12" to high conductivity and low conductivity simulation, the resulting waveforms will be similar to those illustrated in FIG. 5. Time constant of certain waveform portions, time of occurrence of certain portion and amplitude of certain portions are determined and compared to acceptable reference values. With respect to time constant of the exponential portions of the waveforms, by evaluating the known equation for an exponential response at two arbitrary times and dividing one by the other, it is determined that for a constant time spacing between two data points the ratio of the amplitudes must be constant. Therefore data points are collected at equal time intervals along the expotential portion, the first data point divided by the third, the second by the fourth, and so on and and then an average value is computed and compared to upper and lower acceptance values to establish pass-fail criteria. With respect to amplitude or steady state value, data points are recorded and likewise contrasted to upper and lower levels. The same procedure is followed for time occurrence of selected portions of the waveforms.

It is therefore apparent that the present invention accomplishes its intended objects. While an embodiment of the present invention has been described in detail, this is done for the purpose of illustration, not limitation.

I claim:

1. Apparatus for testing a circuit which senses the condition of an electrical quantity, said quantity being electrical conductivity, said sensing circuit having a pair of sensing terminals, a sensor portion operatively connected to said terminals for indicating a predetermined condition of the electrical quantity associated with a load connected between said terminals, and a current conducting component which is activated in response to a predetermined amount of energy supplied thereto after said sensor indicates said condition of said electrical quantity, said component to be activated in response to conductivity greater than a given value, said testing apparatus comprising:

(a) a pair of terminals for connection to said sensing circuit terminals;

(b) a network connected to said terminals for simulating a load having the electrical quantity to which said sensing circuit is responsive, said network having at least one branch which simulates the existence of said predeteremined condition in said load, said branch including timing means causing said predetermined condition to be simulated for a period of time adequate to test the response of said sensing circuit but inadequate to provide sufficient energy to activate said component, said network branch having an initial low resistance to simulate conductivity greater than said given value and which then is changed in response to said timing means to a high resistance to simulate conductivity lower than said predetermined value thereby enabling testing the electrical continuity of said component in response to conductivity greater than said given value and in a manner preventing activation of said component; and (c) monitoring means connected to said terminals for comparing the actual response of said sensing circuit to the load simulation provided by said network to the desired response of said network.

2. Apparatus according to claim 1, wherein said network has a second branch which simulates the absence of said predetermined condition in said load.

3. Apparatus according to claim 2, further including switching means between said network and at least one of said testing apparatus terminals for selecting which of said branches is connected to said terminals.

4. Apparatus according to claim 1, wherein said sensing circuit includes a battery for supplying voltage to said circuit and wherein said testing apparatus includes circuit means for disconnecting said network from said testing apparatus terminals and for completing a circuit including said sensing circuit battery and said monitoring means for monitoring the operation of said battery.

5. Apparatus according to claim 1, wherein said monitoring means includes means for indicating whether the actual and desired responses of said sensing circuit are within or without a predetermined range of coincidence.

6. Apparatus according to claim 1, wherein said monitoring means includes an oscilloscope.

7. Apparatus according to claim 6, wherein said oscilloscope has a flat screen provided with graphical information to visually indicate whether the actual and desired responses of said sensing circuit are within or without a predetermined range of coincidence.

8. Apparatus according to claim 1, wherein said monitoring means includes microprocessor means for comparing information from waveforms indicating the actual response of said sensing circuit to information stored in said microprocessor means representing the desired response of said sensing circuit and for indicating whether the actual and desired responses of said sensing circuit are within or without a predetermined range of coincidence.

9. Apparatus according to claim 1, wherein said current conducting component of said sensing circuit is an electro explosive device which is detonated when electrical energy of said predetermined amount is supplied thereto.

10. Apparatus according to claim 9, wherein said electro explosive device is included in a release mechanism for uncoupling a parachute canopy from its load upon landing in water, said canopy being uncoupled when said electro explosive device is detonated, and said electro explosive device being detonated when said electrode means is exposed to water having a predetermined condition of conductivity.

11. A method for testing a circuit which senses the electrical conductivity of fluid, said sensing circuit having a pair of terminals adapted to be exposed to said fluid, a sensor portion operatively connected to said terminals for signalling a predetermined condition of the conductivity of fluid contacting said terminals, and a current conducting electro explosive device which is detonated in response to a predetermined amount of energy supplied thereto after said sensor portion indicates said predetermined condition of conductivity, said method comprising the steps of:

(a) applying to said sensing circuit terminals a load simulating said predetermined condition of fluid conductivity for a time adequate to test said sensing circuit but inadequate to provide sufficient electrical energy to detonate said electro explosive device;

(b) applying to said sensing circuit during the remainder of the testing time period a load simulating fluid conductivity less than said predetermined condition; and (c) monitoring the response of said sensing circuit to said load simulation including comparing the actual response of said sensing circuit to a desired response of said sensing circuit.

12. A method according to claim 11, wherein each of said steps of applying a load to said sensing circuit comprises applying a resistive load.

13. A method according to claim 11, wherein said steps of applying a load to said sensing circuit comprises:

(a) applying to said sensing circuit terminals a network including two portions connected in parallel, the first of said portions comprising a low magnitude resistor in series with a capacitor and the second of said portions including a relatively higher magnitude resistor; and (b) operating said network in a manner such that initially said sensing circuit responds only to said low magnitude resistor simulating conductivity greater than said given value and then after the voltage increases on said capacitor during said period of time said circuit responds to said higher magnitude resistor simulating conductivity less than said given value.

14. Apparatus for testing a circuit senses the condition of an electrical quantity, said quantity being electrical conductivity, said sensing circuit having a pair of sensing terminals, a sensor portion operatively connected to said terminals for indicating a predetermined condition of the electrical quantity associated with a load connected between said terminals, and a current conducting component which is activated in response to a predetermined amount of energy supplied thereto after said sensor indicates said condition of said electrical quantity, said component to be activated in response to conductivity greater than a given value, said testing apparatus comprising:

(a) a pair of terminals for connection to said sensing circuit terminals;

(b) a network connected to said terminals for simulating a load having the electrical quantity to which said sensing circuit is responsive, said network having at least one branch which simulates the existence of said predetermined condition in said load, said branch including timing means causing said predetermined condition to be simulated for a period of time adequate to test the response of said sensing circuit but inadequate to provide sufficient energy to activate said component, said network branch having an initial low resistance to simulate conductivity greater than said given value and which then is changed in response to said timing means to a high resistance to simulate conductivity lower than said predetermined value thereby enabling testing the electrical continuity of said component in response to conductivity greater than said given value and in a manner preventing activation of said components, said network branch including two portions connected in parallel, the first of said portions comprising a low magnitude resistor in series with a capacitor and the second of said portions including a relatively higher magnitude resistor, said network operating in a manner such that initially said sensing circuit responds only to said low magnitude resistor simulating conductivity greater than said given value and then after the voltage increases on said capacitor during said period of time said circuit responds to said higher magnitude resistor simulating conductivity less than said given value; and (c) monitoring means connected to said terminals for comparing the actual response of said sensing circuit to the load simulation provided by said network to the desired response of said network.

* * * * *

UNITED STATES PATENT AND TRADEMARK OFFICE
CERTIFICATE OF CORRECTION

PATENT NO. : 4,680,537

DATED : July 14, 1987

INVENTOR(S) : Francis M. Miller

It is certified that error appears in the above-identified patent and that said Letters Patent are hereby corrected as shown below:

Claim 14, line 1, the word --which-- should be inserted after "circuit" and before "senses".

Signed and Sealed this

Fifteenth Day of December, 1987

Attest:

DONALD J. QUIGG

*Attesting Officer*         *Commissioner of Patents and Trademarks*